United States Patent [19]

Shimizu

[11] Patent Number: 5,295,174

[45] Date of Patent: Mar. 15, 1994

[54] SHIFTING CIRCUIT AND SHIFT REGISTER

[75] Inventor: Shin Shimizu, Tokyo, Japan

[73] Assignee: Nippon Steel Corporation, Tokyo, Japan

[21] Appl. No.: 795,501

[22] Filed: Nov. 21, 1991

[30] Foreign Application Priority Data

Nov. 21, 1990 [JP] Japan .................. 2-319518

[51] Int. Cl.⁵ .............................................. G11C 19/00
[52] U.S. Cl. ........................................ 377/76; 328/105; 328/152; 307/602; 307/242; 377/81
[58] Field of Search ................... 377/75, 76, 77, 81; 307/602, 608, 242; 328/152, 153, 103, 106

[56] References Cited

U.S. PATENT DOCUMENTS

| 3,421,092 | 1/1969 | Bower et al. | 377/81 |
| 3,753,241 | 8/1973 | Bayne | 377/81 |
| 4,627,085 | 12/1985 | Yuen | 377/81 |
| 4,837,790 | 6/1989 | Harada | 377/81 |
| 4,852,130 | 7/1989 | Draxelmayr | 377/81 |
| 4,876,704 | 10/1989 | Ozaki | 377/77 |
| 5,150,389 | 9/1992 | Kawasaki | 377/81 |

FOREIGN PATENT DOCUMENTS 0105396 4/1990 Japan .

Primary Examiner—John S. Heyman
Attorney, Agent, or Firm—Pollock, Vande Sande & Priddy

[57] ABSTRACT

A shift register comprises a plurality of latch circuits for latching time series signals inputted thereto, a multiplexer for selecting outputs of the latch circuits in sequence, and a clock control circuit for generating clocks used for controlling selection timings of the multiplexer, wherein the timing for selecting the output of a certain latch circuit is delayed with respect to the latch timing of the certain latch circuit by a predetermined timing. Accordingly, the number of elements constituting the shift register circuit is decreased and the power consumption is reduced.

7 Claims, 4 Drawing Sheets

F I G. 4
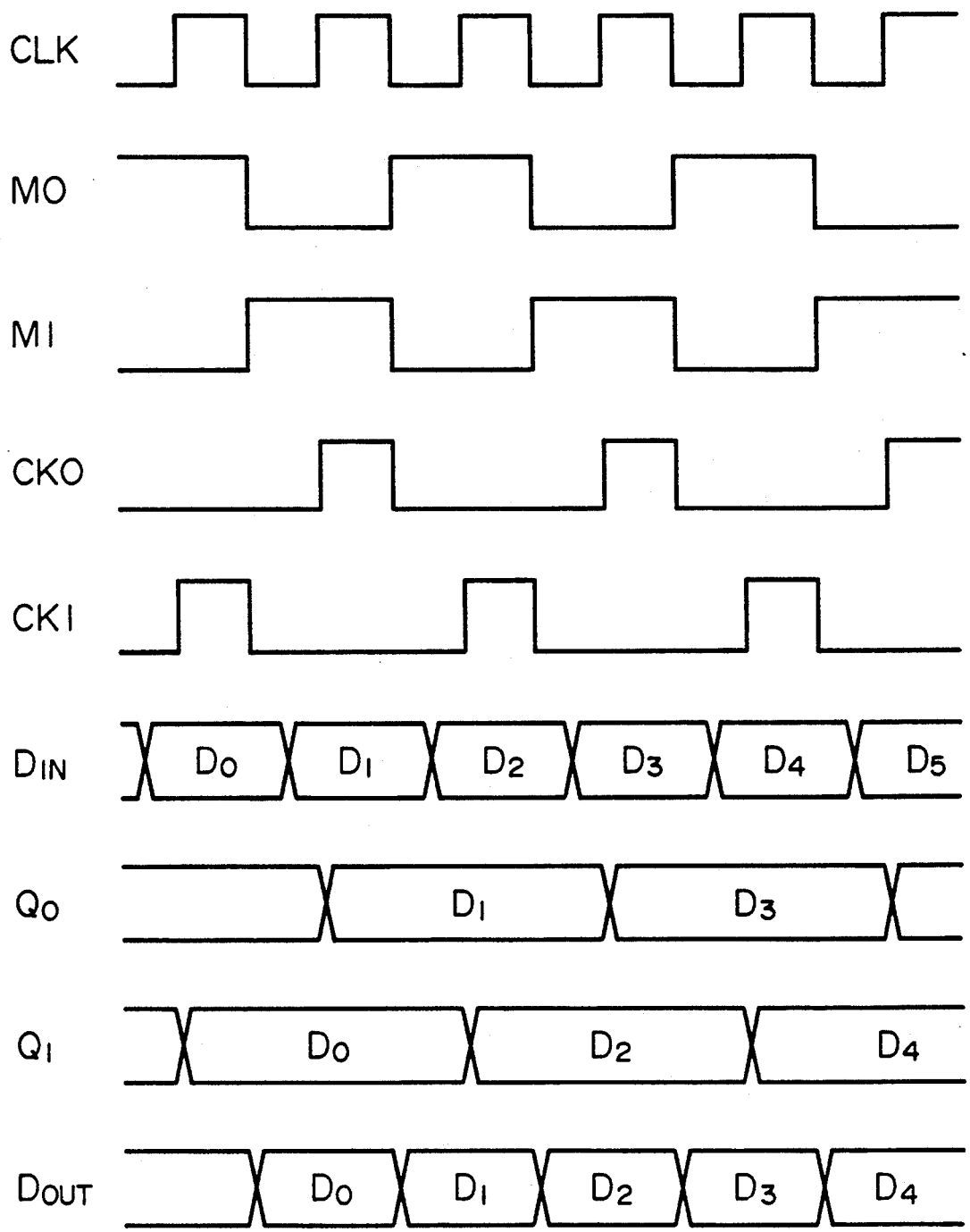

SHIFTING CIRCUIT AND SHIFT REGISTER

FIELD OF THE INVENTION

The present invention relates to a shifting circuit for shifting time digital signals series in sequence, to output the shifted signals, and a shift resistor employing the same.

BACKGROUND OF THE INVENTION

A shift register is widely used to delay a serial signal and output the signal, or as one means for performing the serial to parallel conversion.

A shifting circuit used with the prior art shift register is constructed by flip-flop circuits employing NAND circuits or NOR circuits, or by flip-flop circuits having two latch circuits connected in series. For example, JP-A-2-105396 (1990) by Akiyama et al. discloses a shift register in which a plurality of memory cells each being constructed by two latch circuits are connected in series.

The shifting circuit constructed by such a flip-flop circuit requires for example about sixteen transistor devices per stage in the case where a master-slave flip-flop is used. Since the shift register is constructed by connecting such shifting circuits in series by the number of shifting stages, for example, in the case where the shift register having a thousand stages is manufactured, there is required one thousand flip-flop circuits or two thousand latch circuits. Therefore, the number of devices making up the shift resister becomes very enormous, so that the prior art shift register is not suitable for higher integration. This is one problem.

In addition, with the prior art shifting circuit, since almost all the elements are simultaneously operated, there arises another problem in that the power consumption when those elements are operated as the shift register is very large.

SUMMARY OF THE INVENTION

The present invention was made in order to solve the above problems and it is therefore an object of the present invention to provide a newly developed shifting circuit which is suitable for the higher integration and with lower power consumption, and a shift register employing the same.

According to the present invention, there is provided a shifting circuit used for a shift register, for delaying time series signals inputted thereto by a predetermined timing and output the delayed time series signal, comprising:

an input line;
an output line;
a clock control circuit for generating latch clocks and selection clocks;
a plurality of latch circuits having respective output terminals and respective input terminals connected in parallel with the input line, the latch circuits serving to latch the input signals synchronistically with the respective latch clocks to output the input signals; and
a multiplexer having input terminals connected to the respective output terminals of the latch circuits, the multiplexer serving to select outputs of the latch circuits in sequence synchronistically with the respective selection clocks to provide the outputs on the output line in sequence, wherein the clock control circuit delays the selection clock used for selecting the output from a certain latch circuit with respect to the latch clock synchronistically with which the certain latch circuit latchs the input signal by the predetermined timing.

The present invention also provides a shift register constructed by connecting the above shifting circuits in series.

In the operation of the shifting circuit of the present invention, the provided number of the latch circuits latch the input signals such as time series digital signals in sequence. A predetermined timing after the latch timing when the individual circuits latched the respective signals, the multiplexer read out in sequence the signals latched in the latch circuits to provide the signals thus read out on the output terminal in sequence. The delay of the reading out timing can be selected up to the clock number which is the same number as that of the latch circuits.

Since the shifting circuit of the present invention is constructed by one latch circuit with respect to the shifting operation of one stage, it can be constructed by the elements the number of which is approximately one-half, as compared with the case where the prior art circuit requires two latch circuits for example, with respect to the shifting operation of one stage.

Further, since in the shift register of the present invention, the number of elements is reduced, it is possible to attain higher integration. Moreover, since during the operation of the shift register, only some elements which are selected with the clock signals from the clock control circuit are simultaneously operated, electric energy which is consumed at the same time is excessively reduced. Thus, the shift register of the present invention is suitable for higher integration.

BRIEF DESCRIPTION OF THE DRAWINGS

FIG. 4 is a timing chart explaining the operation of the shifting circuit shown in FIG. 2 and FIG. 3.

DESCRIPTION OF THE PREFERRED EMBODIMENTS

Figure 1:
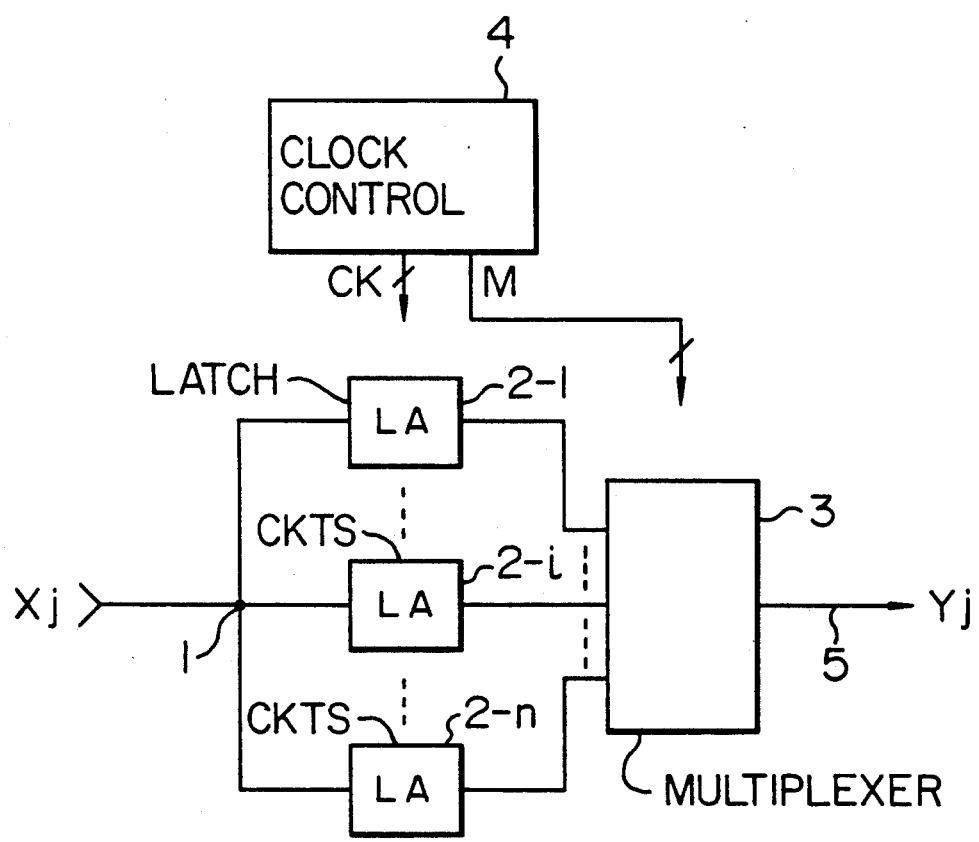
FIG. 1 is a block diagram showing the arrangement of one shifting circuit of the present invention.

FIG. 1 is a block diagram showing the arrangement of one embodiment of a shifting circuit of the present invention. In the figure, the reference numeral 1 designates an input terminal to which time series signals Xj are supplied. The reference numerals 2-1, ..., 2-i, ..., and 2-n designate n latch circuits LA, respectively, of which input terminals are connected in common to the input terminals 1. The reference numeral 3 designates a multiplexer MP of which input terminals are connected to output terminals of the individual latch circuits, respectively. The reference numeral 4 designates a clock control circuit CL which supplies each of the latch circuits 2-1, ..., 2-i, ..., and 2-n with latch clocks CK and the multiplexer 3 with selection clocks M. The reference numeral 5 designates an output terminal for providing therethrough outputs from the multiplexer 3.

The individual latch circuits LA (2-1, ..., 2-i, ..., and 2-n) enable the respective input gates in sequence synchronistically with the latch clocks CK which are supplied to the n latch circuits LA by the clock control circuit 4, fetch therein the time series signals Xj (j=1, ..., i, ... n, n+1, ...), which were inputted to the input terminal 1, one by one, and hold these signals until they receive the respective latch clocks CK. That is, the latch circuits 2-1, ..., 2-i, ... and 2-n latch X1, ..., Xi, ..., and Xn, respectively. Further, through the subsequent operation, the latch circuits 2-1, ..., and 2-n latch n time series signals Xn+1, ..., and X2n, respectively. Similarly, in the subsequent operation, the group of time series signals is latched by the latch circuits 2-1, ..., 2-n.

The multiplexer 3 serves to enable the input gates which are connected to the output terminals of the latch circuits LA (2-1, ..., 2-i, ..., ... and 2-n), respectively, in turn synchronistically with the selection clocks M which are supplied to the multiplexer 3 by the clock control circuit 4. Moreover, the multiplexer 3 serves to fetch the signals latched in the latch circuits to output them in the form of time series signals Yj to the output terminal.

Then, the timing of the selection clock M used for driving the input gate of the multiplexer connected to the output terminal of a certain latch circuit is delayed with respect to the timing of the latch clock CK used for driving the input gates of the certain latch circuit, by a predetermined pulse number k of which maximum value is n. Therefore, the shifting circuit of the present invention delays the time series signals Xj supplied to the input terminals by a predetermined timing, that is, k bits, to provide that signal in the form of time series output signals Yj through the output terminal 5.

Thus, the shifting circuit of the present invention serving to delay the input signals by a predetermined timing of which maximum value is n bits is made up of n latch circuits, one multiplexer, and one clock control circuit. A 1 bit-shift register of the prior art requires two latch circuits, in addition to a peripheral circuit, and an n bit-shift register thereof requires 2n latch circuits, whereas the shifting circuit of present invention is made up of the extremely lower number of elements.

Figure 2:
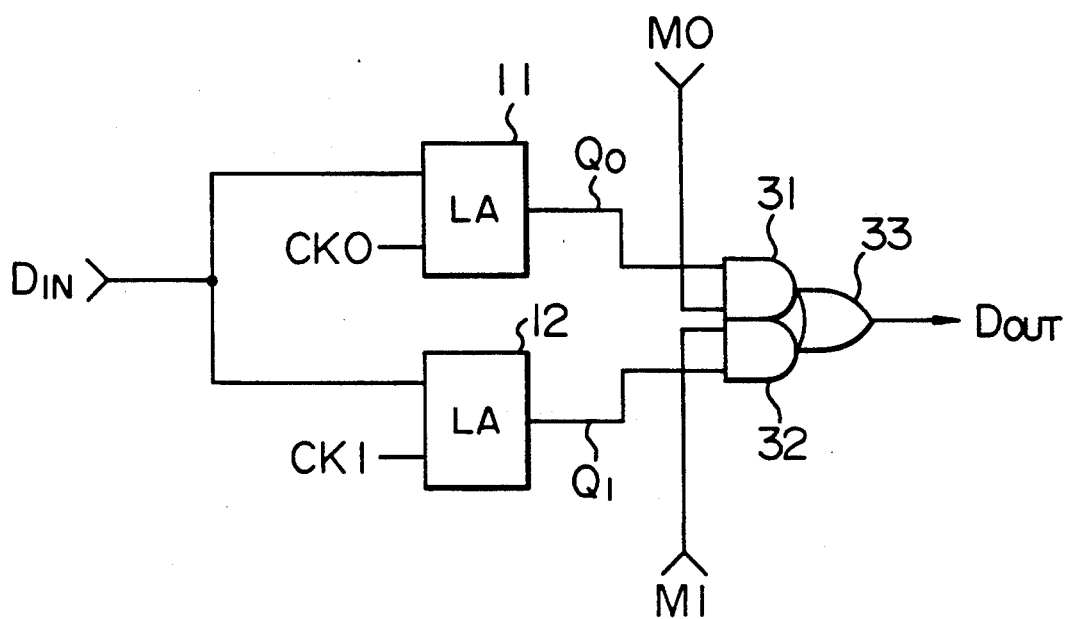
FIG. 2 is a block diagram showing the relationship in arrangement between latch circuits and a multiplexer in another shifting circuit of the present invention.
Figure 3:
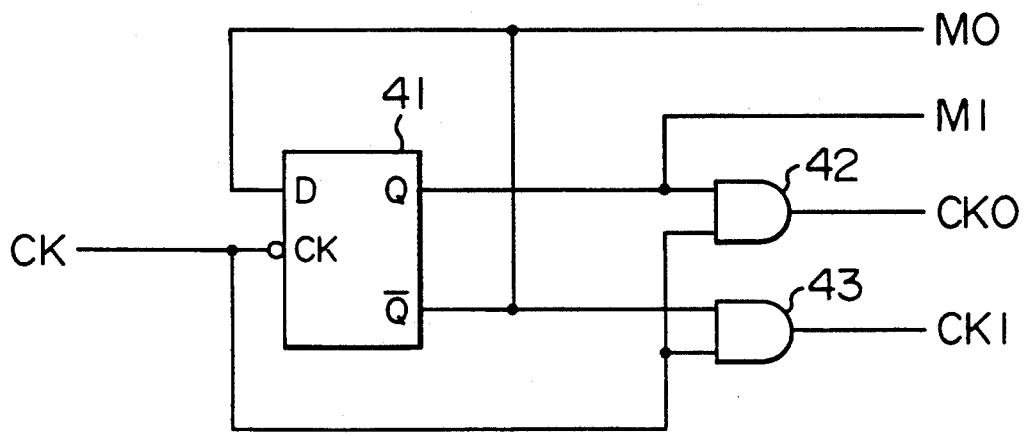
FIG. 3 is a block diagram showing the arrangement of a clock control circuit in the example shown in FIG. 2.

FIG. 2 is a block diagram showing the arrangement of a latch circuit and a multiplexer in an example of a 2-bit-shifting circuit of the present invention. FIG. 3 is a block diagram showing the arrangement of a clock control circuit. FIG. 4 is a timing chart for explaining the operation of the example shown in FIG. 2 and FIG. 3.

In FIG. 2, the reference numerals 11 and 12 designate latch circuits for receiving input signal $D_{IN}$ at respective input terminals, the reference numeral 31 designates an AND circuit for receiving an output Q0 from the latch circuit 11, the reference numeral 32 designates an AND circuit for receiving an output Q1 from the latch circuit 12, and the reference numeral 33 designates an OR circuit for receiving outputs from the AND circuits 31 and 32 to provide the received output as an output $D_{OUT}$ of the shifting circuit. The multiplexer is made up of the AND circuits and the OR circuit. Each of the latch circuits 11 and 12 may be constructed by six field effect transistors.

In FIG. 3, the reference numeral 41 designates a D flip-flop, and the reference numerals 42 and 43 designate AND circuits. The clock control circuit is made up of the D flip-flop and the AND circuits. A terminal D of the flip-flop circuit is connected to an inversion output terminal $\overline{Q}$. An output terminal Q of the flip-flop circuit is connected to one input terminal of the AND circuit 42, and the inversion output terminal $\overline{Q}$ thereof is connected to one input terminal of the AND circuit 42. A terminal CK of the flip-flop circuit 41 is connected to each of the other input terminals of the AND circuits 42 and 43.

The description hereinbelow describes the operation of the shifting circuit of the present invention, which is constructed in the above manner, with reference to FIG. 4.

A reference clock CLK is supplied from the externals of the circuit to the terminal CK of the D flip-flop circuit 41. The clock CLK is divided with frequency by the flip-flop circuit 41 so that a clock M having a frequency of one-half of that of CLK is provided at the output terminal Q. This clock M becomes a selection clock M1 and is supplied together with the AND circuit 42 of the clock control circuit to the AND circuit 32 of the multiplexer. Moreover, a clock into which the clock M is inverted with the phase thereof is provided at the inversion output terminal $\overline{Q}$. This clock becomes a selection clock M0 which is delayed with respect to the selection clock M1 by one pulse and is supplied together with the AND circuit 43 of the clock control circuit to the AND circuit 32 of the multiplexer.

The clock pulse M1 function as a gate pulse for the AND circuit 42. The pulse portion in which the clock pulse M1 and the reference clock CLK have the positive potential in common is provided as a latch clock CK0 to the output terminal of the circuit 42. Similarly, the pulse portion in which the clock pulse M0 provided at the inversion output terminal $\overline{Q}$ and the reference clock CLK have the positive potential in common is provided as a latch clock CK1 to the output terminal of the AND circuit 43. As described above, the latch clock pulses CK0 and CK1 are out of phase and in the 2 bit-shifting circuit of the present invention, the selection clock pulses M0 and M1 are respectively delayed with respect to the latch clock pulses CK0 and CK1 by one pulse.

The latch clock CK0 is inputted to the latch circuit 11 and the signals D0, D2, D4, ... out of the input signals $D_{IN}$ (D0, D1, D2, D3, ...), which are present at the time of rise of the clock CK0, are latched in sequence in the circuit 11. Therefore, the time series signals consisting of the signals D0, D2, D4, ... are provided at the output terminal Q0 of the latch circuit 11. Similarly, the latch clock CK1 is inputted to the latch circuit 12 and the signals D1, D3, D5, ... out of the input signals $D_{IN}$ (D0, D1, D2, D3, ...), which are present at the time of rise of the clock CK1, are provided in sequence at the output terminal Q1 of the latch circuit 12.

When the output signal Q0 of the latch circuit 11 consists of the signals D0, D2, D4, ..., the selection clock M0 activates the AND circuit 31 so that the signal Q0 is outputted as the output $D_{OUT}$ through the OR circuit 33. On the other hand, when the output signal Q1 of the latch circuit 12 consists of the signals D1, D3, D5, ..., the selection clock M1 activates the AND circuit 32 so that the output signal Q1 is outputted as the output $D_{OUT}$ through the OR circuit 33. The OR circuit 33 composes the output signal Q0, that is, the group of the signals D0, D2, D4, ... and the output signal Q1, that is, the group of the signals D1, D3, D5, ... to output the composite signal as one-pulse delayed output signal $D_{OUT}$, that is, the group of signals D0, D1, D2, D3, D4, ....

In order to more concretely understand the operation, the description will hereinbelow be given to the operation in the vicinity of the input signal D2 in FIG. 4 as an explanatory example.

The input signal D1 is latched in the latch circuit 11 and is provided as the output Q0. Since the selection signal M0 is at the high potential, that signal D1 is provided as the output signal $D_{OUT}$ through the AND circuit 31 and the OR circuit 33. Then, when the latch clock CK1 rises, the latch circuit 12 is triggered, the input signal D2 is fetched in the circuit 12 to be latched therein and the signal D2 is provided as the output Q1 from the latch circuit 12. However, since the selection clock M1 is at the low potential, the output of the AND circuit is maintained at the low potential. Next, when the selection clock M0 is changed to the low potential, the output of the AND circuit 31 becomes the low potential irrespective of the input. Alternatively, since the selection clock M1 becomes the high potential, the multiplexer outputs the output D2 of the latch circuit 12 through the AND circuit 32 and the OR circuit 33. At this time, the input signal $D_{IN}$ is changed to the signal D3, and when the latch clock CK0 subsequently rises, the signal D3 is fetched in the latch circuit 11 to be latched therein. By the above-mentioned operation of the shifting circuit of the present invention, the input signal $D_{IN}$ becomes the output signal $D_{OUT}$ being delayed by one pulse.

Figure 5:
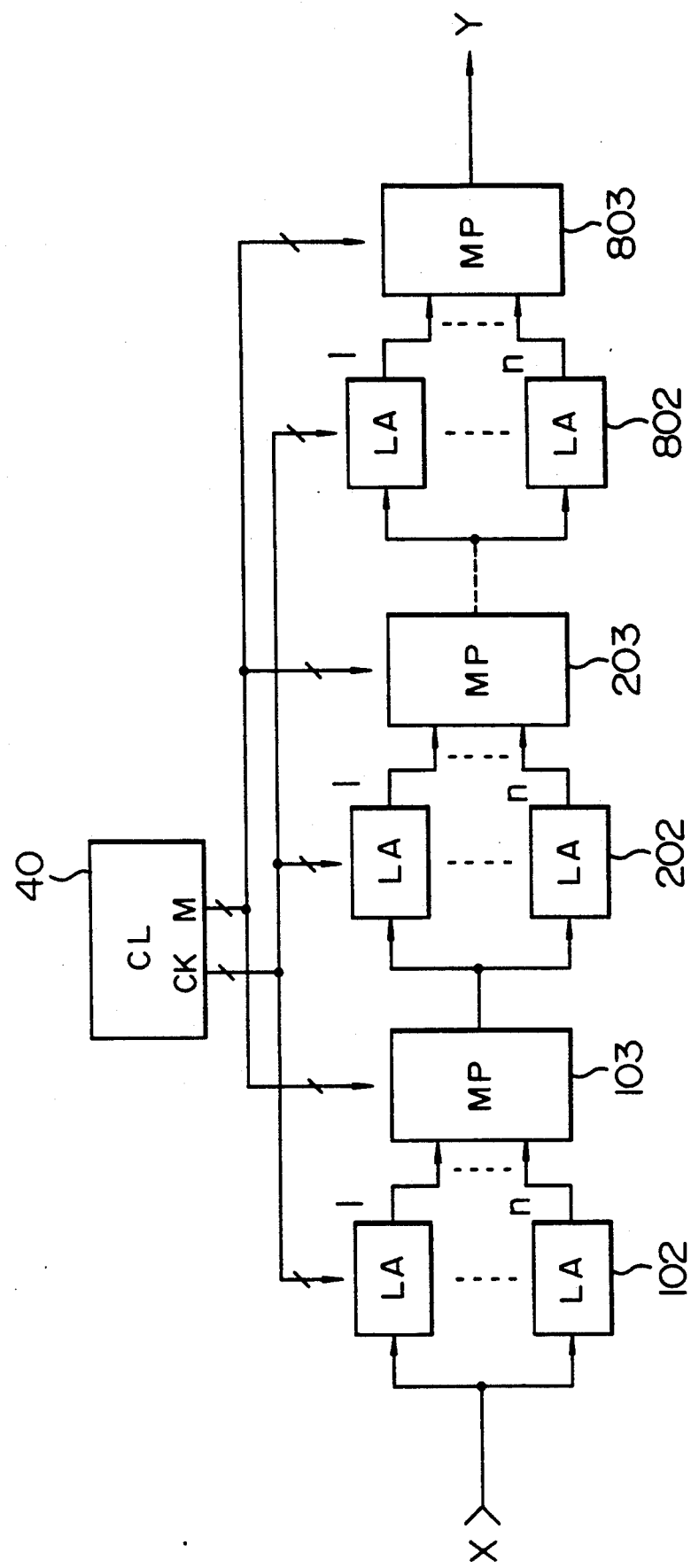
FIG. 5 is a block diagram showing the arrangement of a shift register of the present invention.

FIG. 5 is a schematic block diagram showing a shift register of the present invention which is constructed using the shifting circuit of the present invention shown in FIG. 1.

The figure illustrates the arrangement in which the shifting circuits of eight stages are connected in series. In the figure, the reference numerals 102 and 103 designate the first stage of a latch circuit group and a multiplexer, respectively, the reference numerals 202 and 203 designate the second stage of a latch circuit group and a multiplexer, respectively, the reference numerals 802 and 803 designate the eighth stage of a latch circuit group and a multiplexer, respectively, and the reference numeral 40 designates a clock control circuit.

The latch circuit group in each of the stages is made up of n latch circuits and has the same arrangement in each stage. One clock control circuit 40 is provided for the whole shift register, which supplies a common latch clock CK to the latch circuit group in each of the stages, and supplies in common the multiplexer in each stage with a selection clock M which is delayed with respect to the latch clock CK by k bits.

According to the shift register of the present invention which is arranged in such a manner, it is possible to perform the shift the maximum quantity of which is 8×n bits. Further, by adjusting the delay timing of the selection clock M from the clock control circuit 40, an 8×k bit-shift register is obtained. For example, a circuit employing eight 16 bit-shifting circuits makes up a 128 bit-shift register. The shift register of the present invention may also be constructed for shifting by 1,000 bits adapted for an image processor by increasing the number of latch circuits in each stage and by increasing the number of stages.

Since with the shifting circuit of the present invention as described above, the number of circuit elements is small as compared with the prior art circuit, it is possible to attain the higher density integration. Moreover, since the number of elements, which are operated simultaneously at a certain point of time, is small, the power consumption is reduced. Therefore, the shift register of the present invention which is constructed by integrating such shifting circuits can be manufactured as a preferable integrated circuit which is small in size and has the less power consumption.

We claim:

1. A shifting circuit for delaying time series signals inputted thereto by a predetermined timing, comprising:
   an input line for receiving input signals;
   an output line; a clock control circuit for generating latch clocks and selection clocks;
   a plurality of latch circuits each having an output terminal and an input terminal connected in parallel with the input line and for latching the input signals in sequence synchronistically with the respective latch clocks and providing output signals; and
   a multiplexer having input terminals connected to respective output terminals of the latch circuits, for receiving said output signals the multiplexer serving to select the outputs of the latch circuits in sequence synchronistically with the respective selection clocks to provide selected signals to the output line in sequence, wherein the clock control circuit delays the selection clock used for selecting the output of a certain latch circuit by a predetermined timing with respect to a corresponding latch clock with which the certain latch circuit latches the input signal.

2. A shift register constructed by connecting in series a plurality of shifting circuits claimed in claim 1.

3. A shift register claimed in claim 2, wherein the clock control circuits are combined into one component connected to each of the shifting circuits.

4. A shifting circuit for delaying input signals, comprising:
   an input line for providing input signals in a time series manner;
   a plurality of holding circuits connected in parallel with the input line for holding the input signals in sequence;
   a drive circuit, connected to each of the holding circuits, for generating control signals used for driving the holding circuits in sequence, corresponding to sequential timing of the input signals; and
   a fetch circuit, connected to each of the holding circuits and the drive circuit, for fetching the input signals held in the holding circuits to the external side in sequence in accordance with the control signals from the drive circuit, so that the fetch circuit fetches the input signal in a hold circuit located separately from a hold circuit which is holding an input signal synchronistically with fetching of the fetch circuit by a number of hold circuits corresponding to a predetermined time delay for input signals.

5. A shift register constructed by connecting in series a plurality of shifting circuits claimed in claim 4.

6. A shift register comprising:
   a common input terminal;
   a first holding circuit group having a plurality of first holding circuits connected in parallel with said common input terminal for holding input signals inputted thereto in a time series manner, in sequence;

a first fetch circuit connected to the first holding circuit group, for fetching the signals held in the first holding circuit group from the first holding circuits, to the external side in sequence;

a second holding circuit group having a plurality of second holding circuits connected in parallel with said common input terminal for holding the signals fetched by the first fetch circuit, in sequence;

a second fetch circuit connected to the second holding circuit group, for fetching the signals held in the second holding circuit group from the second holding circuits, to the external side in sequence; and drive means for driving the first holding circuit group, the first fetch circuit, the second holding circuit group, and the second fetch circuit synchronistically with the respective predetermined timings.

7. A shift register comprising:

an input terminal for receiving and providing input signals in a time series manner;

a plurality of shifting circuits connected in series, each of the shifting circuits including a plurality of holding circuits for holding input signals inputted thereto in a time series manner, in sequence, and a fetch circuit connected to each of the holding circuits, for fetching the signals held in the respective holding circuits to the external side in sequence; and drive means for driving each of the shifting circuits in a time series manner.

* * * * *